(12) United States Patent
Kinjo

(10) Patent No.: US 12,114,530 B2
(45) Date of Patent: Oct. 8, 2024

(54) DISPLAY DEVICE INCLUDING A FIRST ELECTRODE INCLUDING AN END PORTION INSIDE A TRENCH

(71) Applicant: Japan Display Inc., Tokyo (JP)

(72) Inventor: Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 328 days.

(21) Appl. No.: 17/651,833

(22) Filed: Feb. 21, 2022

(65) Prior Publication Data

US 2022/0285453 A1 Sep. 8, 2022

(30) Foreign Application Priority Data

Mar. 2, 2021 (JP) ................... 2021-032636

(51) Int. Cl.
*H10K 59/121* (2023.01)
*H10K 59/35* (2023.01)

(52) U.S. Cl.
CPC ......... *H10K 59/121* (2023.02); *H10K 59/353* (2023.02)

(58) Field of Classification Search
CPC .................................................... H10K 59/121
See application file for complete search history.

(56) References Cited

U.S. PATENT DOCUMENTS

| | | |
|---|---|---|
| 2004/0253756 A1 | 12/2004 | Cok et al. |
| 2007/0200491 A1 | 8/2007 | Seo et al. |
| 2016/0141341 A1* | 5/2016 | Kajiyama ................ G09G 3/30 257/89 |
| 2016/0307976 A1* | 10/2016 | You ....................... H10K 59/122 |
| 2017/0324063 A1 | 11/2017 | Ohara et al. |
| 2020/0013834 A1 | 1/2020 | Park et al. |
| 2021/0294138 A1* | 9/2021 | Kitagawa ............ H01L 27/1251 |

FOREIGN PATENT DOCUMENTS

| | | |
|---|---|---|
| JP | 4959119 B2 | 6/2012 |
| JP | 2015-167138 A | 9/2015 |

OTHER PUBLICATIONS

Office Action issued on Oct. 10, 2022, in corresponding Indian Patent Application No. 202214009672; 6 pages.

* cited by examiner

*Primary Examiner* — Suberr L Chi
(74) *Attorney, Agent, or Firm* — Maier & Maier, PLLC

(57) ABSTRACT

According to one embodiment, a display device comprises a pixel circuit, an insulating layer that covers the pixel circuit and includes a first trench, a first electrode disposed on the insulating layer, an organic layer disposed on the first electrode, a second electrode disposed on the organic layer, and a first filling layer that fills at least a part of the first trench. An end portion of the first electrode is located inside the first trench and is covered with the first filling layer.

18 Claims, 14 Drawing Sheets

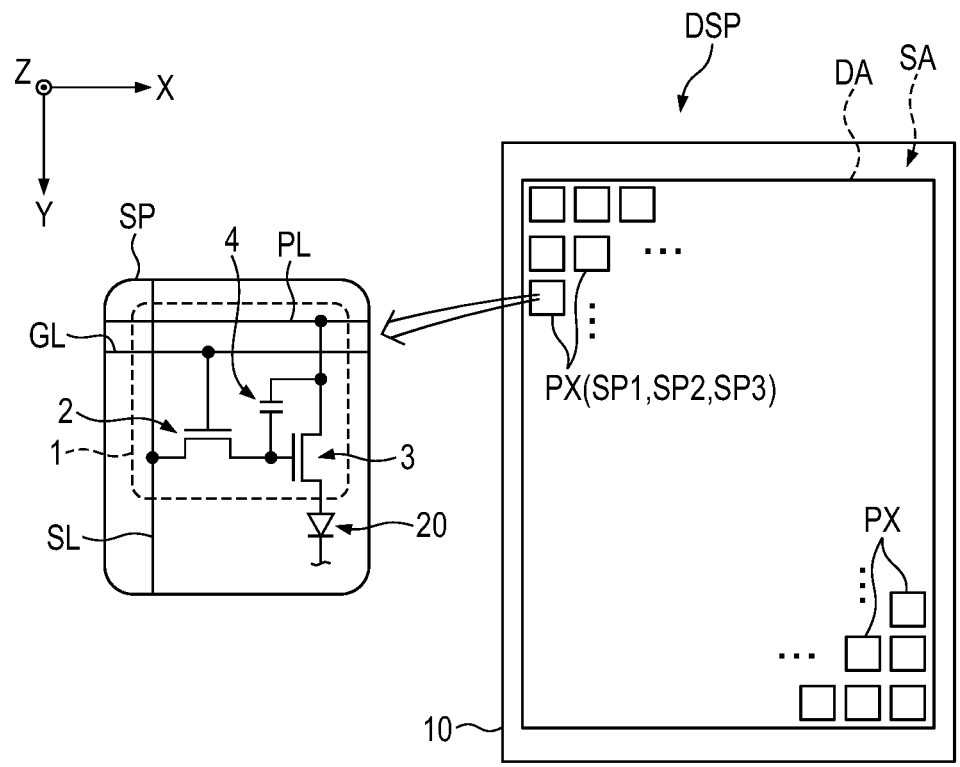
F I G. 1
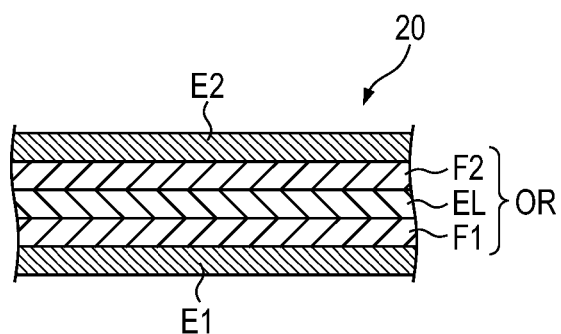
F I G. 2

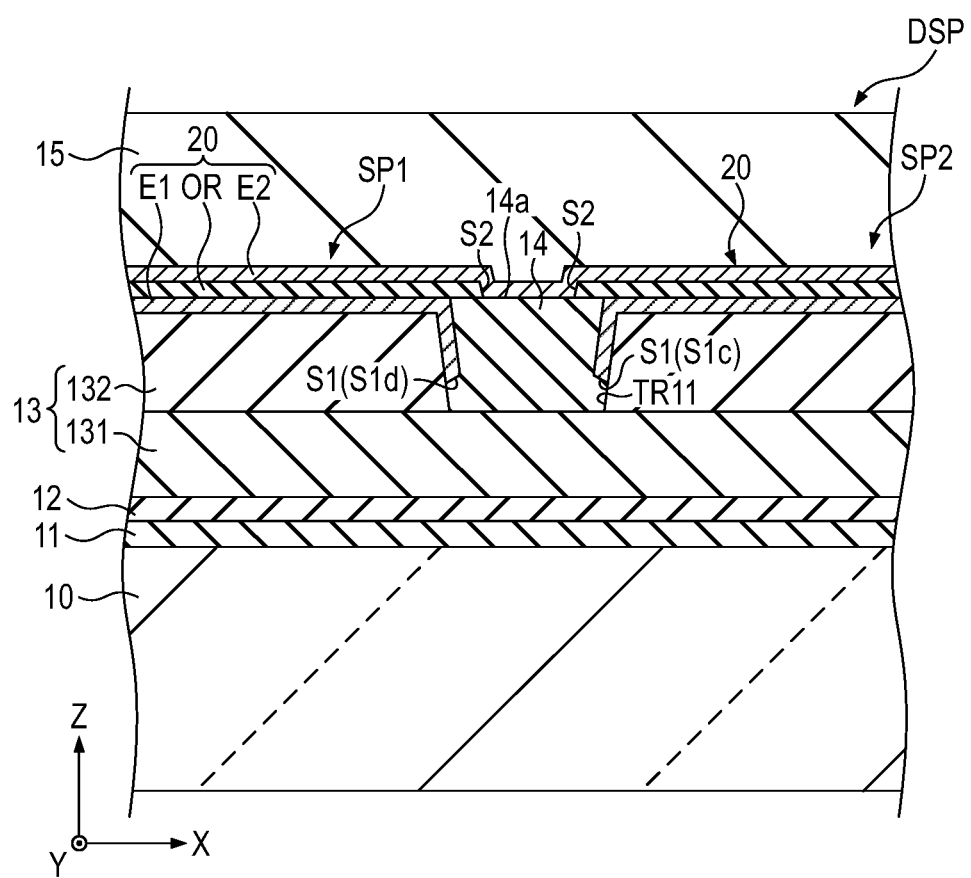
F I G. 5

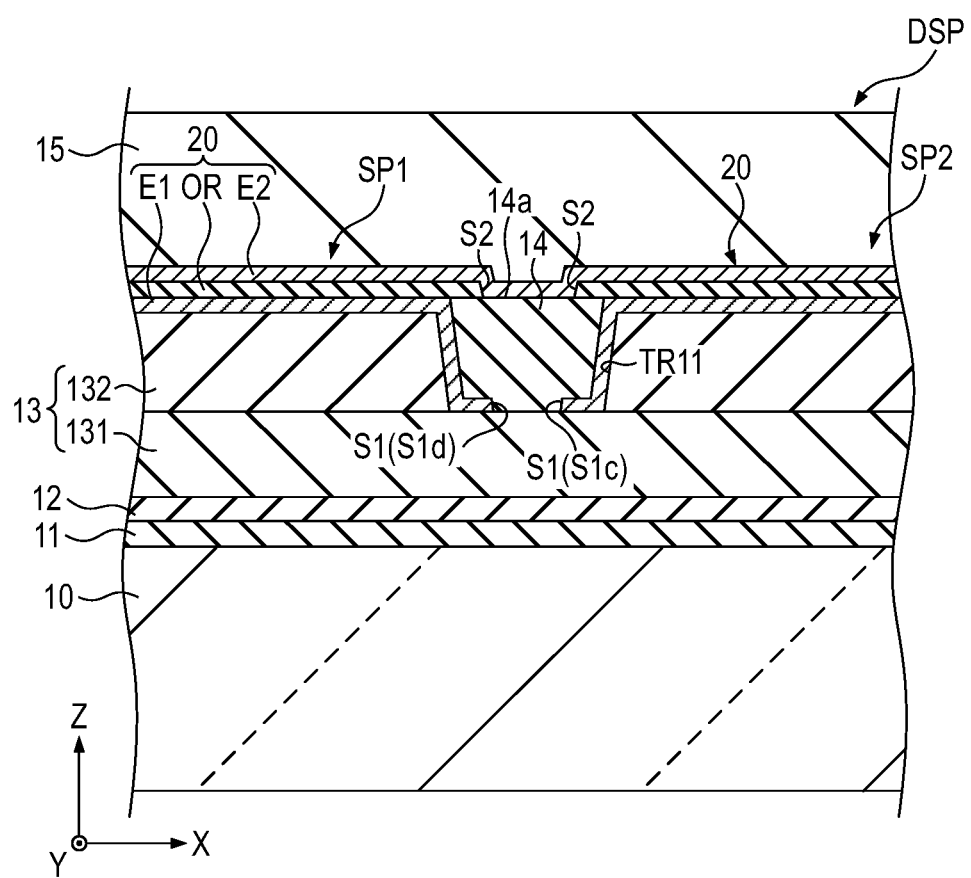
F I G. 6

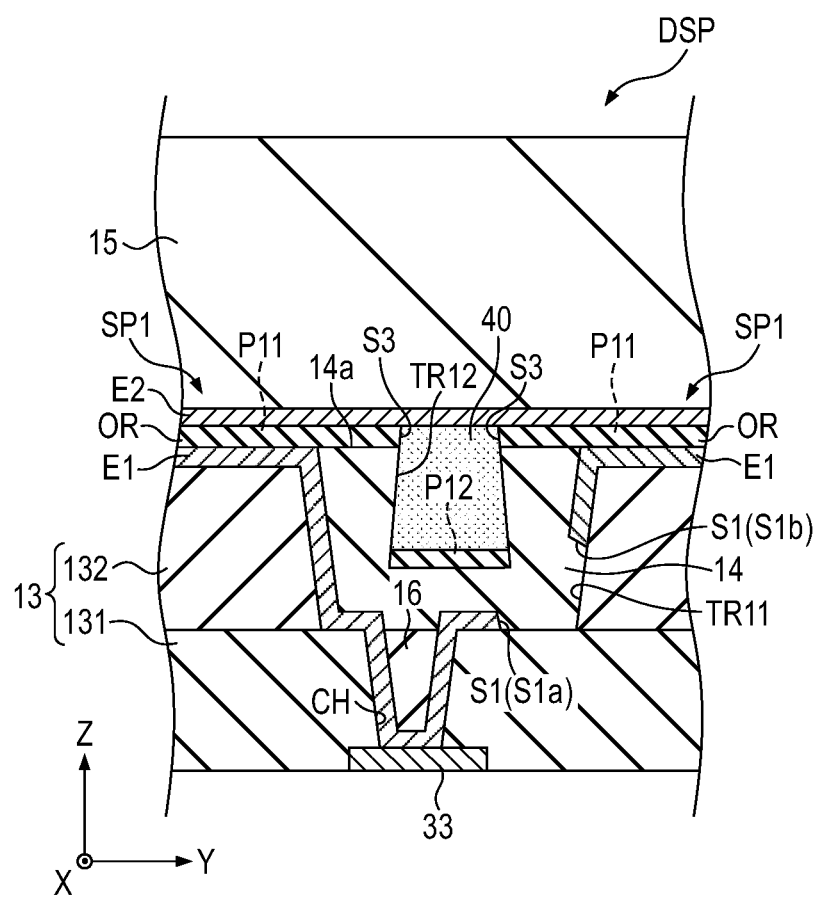
F I G. 11

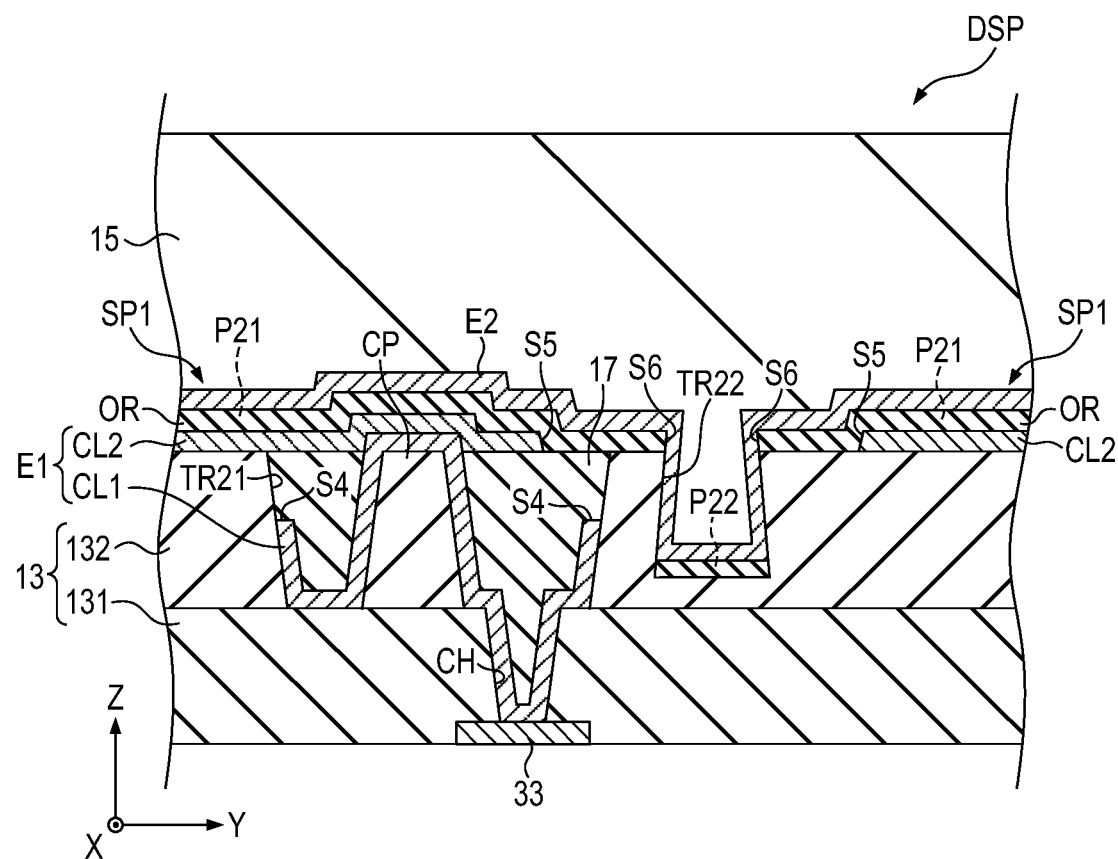
F I G. 14

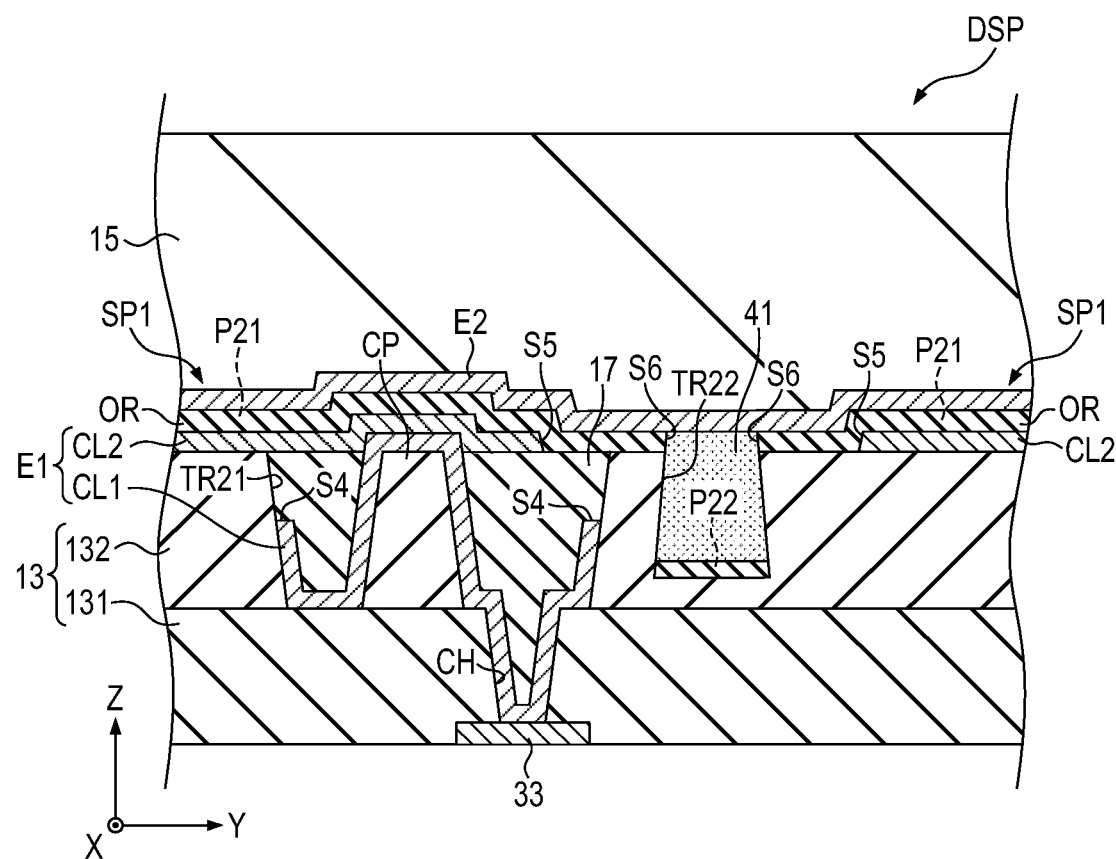
F I G. 15

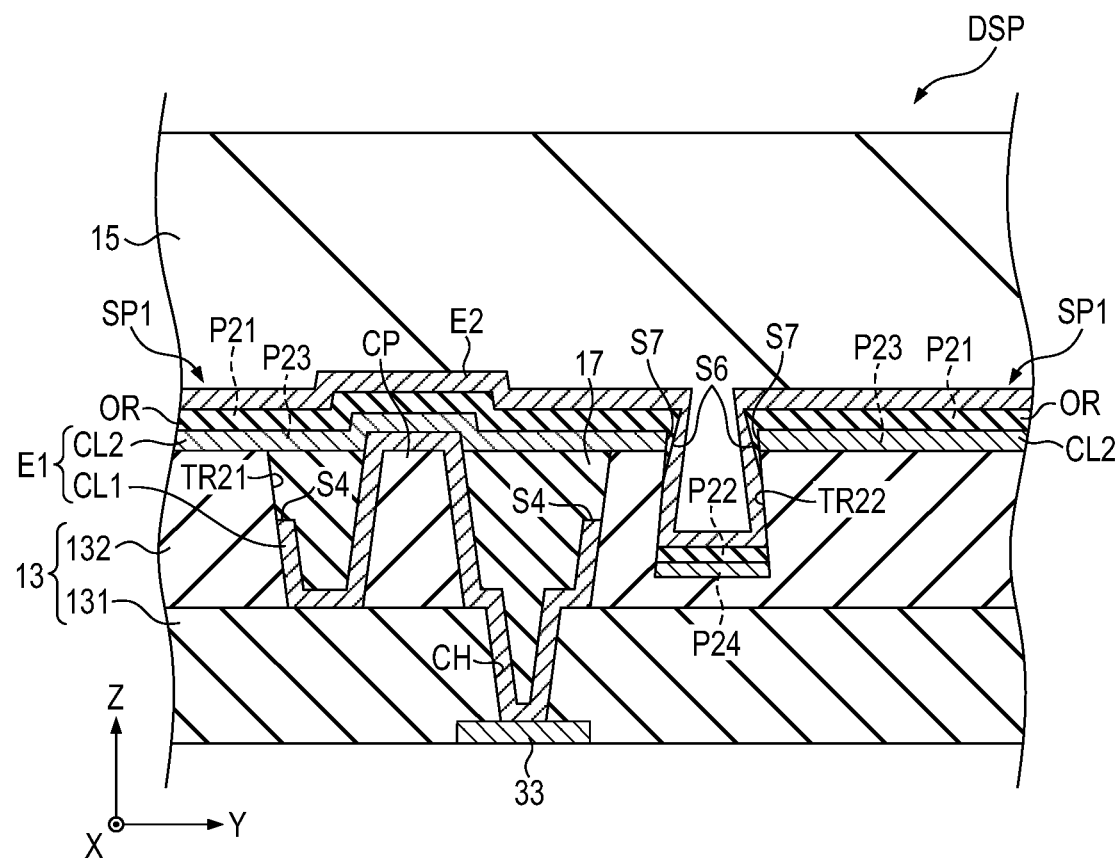
F I G. 16

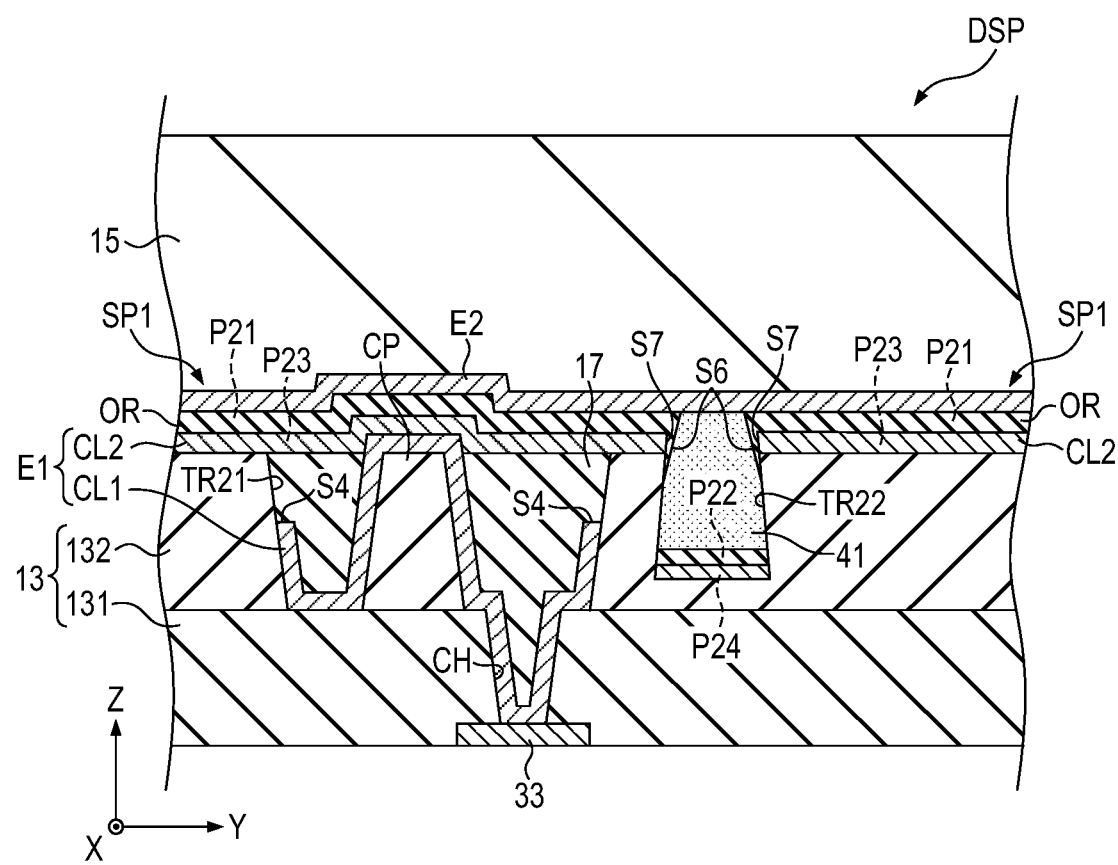
F I G. 17

DISPLAY DEVICE INCLUDING A FIRST ELECTRODE INCLUDING AN END PORTION INSIDE A TRENCH

CROSS-REFERENCE TO RELATED APPLICATIONS

This application is based upon and claims the benefit of priority from Japanese Patent Application No. 2021-032636, filed Mar. 2, 2021, the entire contents of which are incorporated herein by reference.

FIELD

Embodiments described herein relate generally to a display device.

BACKGROUND

In recent years, a display device to which an organic light emitting diode (OLED) is applied as a display element has been put into practical use. This display element includes a first electrode, an organic layer covering the first electrode, and a second electrode covering the organic layer.

The first electrode is provided for each pixel and is formed by patterning by etching or the like. For this reason, an end portion of the first electrode may not have a shape as designed. In addition, the organic layer tends to be thinned near the end portion of the first electrode. For these reasons, there is a risk that the first electrode and the second electrode conduct with each other near the end portion of the first electrode.

BRIEF DESCRIPTION OF THE DRAWINGS

FIG. 1 is a diagram illustrating a configuration example of a display device according to a first embodiment.

FIG. 2 is a schematic cross-sectional view illustrating a configuration example of a display element according to the first embodiment.

FIG. 5 is a schematic cross-sectional view of the display device along V-V line of FIG. 3.

FIG. 6 is a schematic cross-sectional view illustrating another example applicable to the display device according to the first embodiment.

FIG. 11 is a schematic cross-sectional view illustrating another example of the display device according to the fifth embodiment.

FIG. 14 is a schematic cross-sectional view of a display device according to a seventh embodiment.

FIG. 15 is a schematic cross-sectional view illustrating another example of the display device according to the seventh embodiment.

FIG. 16 is a schematic cross-sectional view illustrating still another example of the display device according to the seventh embodiment.

FIG. 17 is a schematic cross-sectional view illustrating still another example of the display device according to the seventh embodiment.

DETAILED DESCRIPTION

Figure 3:
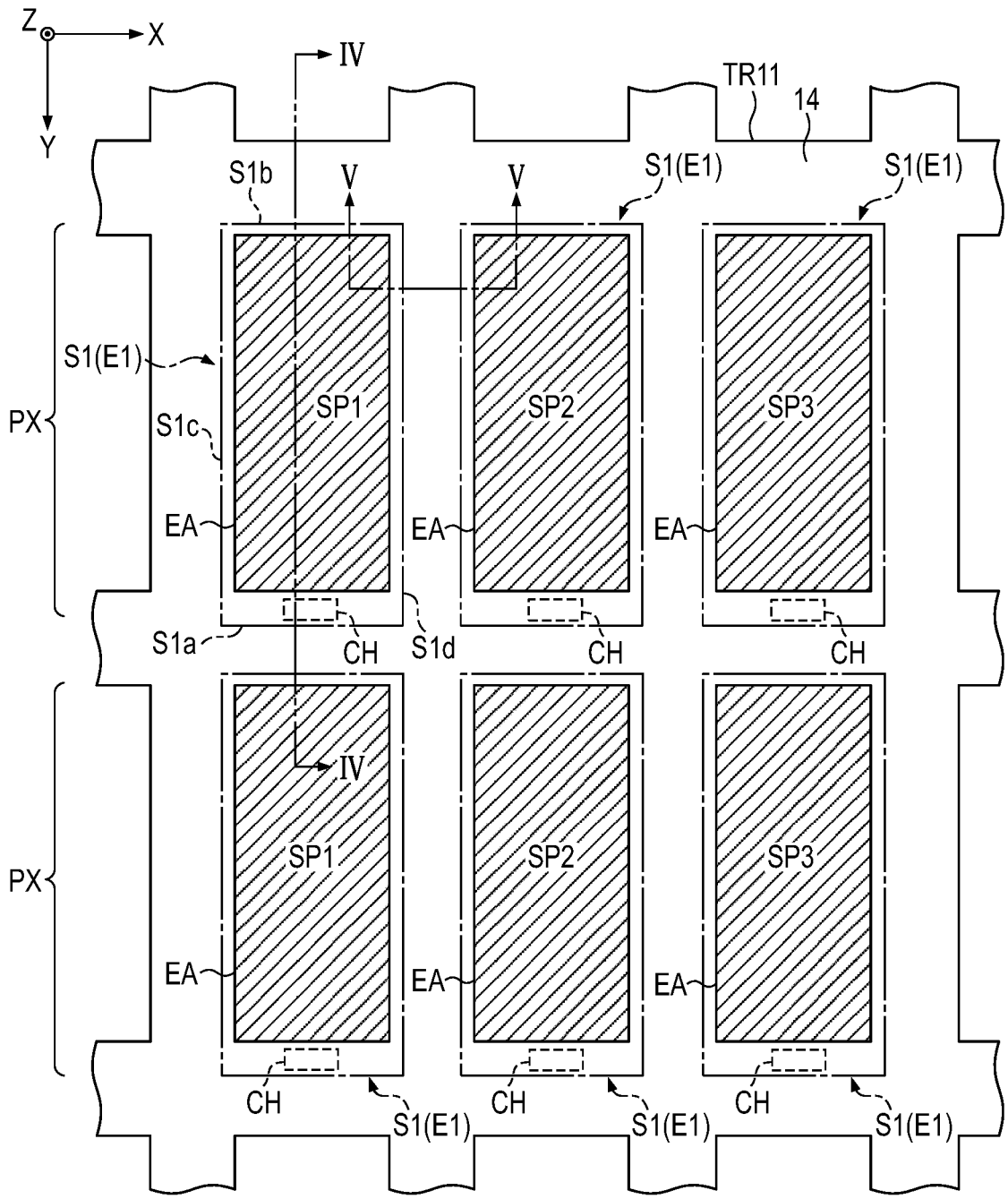
FIG. 3 is a diagram illustrating an example of layout of sub-pixels according to the first embodiment.

In general, according to one embodiment, a display device comprises a pixel circuit, an insulating layer that covers the pixel circuit and includes a first trench, a first electrode disposed on the insulating layer, an organic layer disposed on the first electrode, a second electrode disposed on the organic layer, and a first filling layer that fills at least a part of the first trench. An end portion of the first electrode is located inside the first trench and is covered with the first filling layer.

According to another embodiment, a display device comprises a pixel circuit, an insulating layer that covers the pixel circuit and has a first trench, a first electrode disposed on the insulating layer, an organic layer disposed on the first electrode, a second electrode disposed on the organic layer, and a first filling layer that fills the first trench. The first electrode includes a first conductive layer and a second conductive layer connected to the first conductive layer. An end portion of the first conductive layer is located inside the first trench and is covered with the first filling layer. The second conductive layer is located on the insulating layer and the first filling layer.

According to the display device as described above, the risk of conduction between a first electrode and a second electrode constituting a display element can be reduced.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

The display device DSP of the embodiments is organic electroluminescent display device comprising organic light-emitting diode (OLED) as the display eminent, and can be mounted on TV receivers, personal computers, in-car equipment, tablet terminals, smartphones, mobile telephone terminals and the like

First Embodiment

FIG. 1 is a diagram illustrating a configuration example of a display device DSP according to a first embodiment. The display device DSP has a display area DA for displaying an image and a peripheral area SA outside the display area DA on an insulating base 10. The base 10 may be glass or a flexible resin film.

The display area DA includes a plurality of pixels PX arrayed in a matrix in a first direction X and a second direction Y. The pixel PX includes a plurality of sub-pixels SP. For example, the pixel PX includes a red sub-pixel SP1, a green sub-pixel SP2, and a blue sub-pixel SP3. Incidentally, the pixel PX may include four or more sub-pixels in which sub-pixels of other colors such as white are added in addition to the sub-pixels of the above three colors.

The sub-pixel SP includes a pixel circuit 1 and a display element 20 driven by the pixel circuit 1. The display element 20 is an organic light emitting diode (OLED) as a light emitting element. The pixel circuit 1 includes a pixel switch 2, a drive transistor 3, and a capacitor 4. The pixel switch 2 and the drive transistor 3 are switching elements including, for example, a thin-film transistor.

In the pixel switch 2, a gate electrode is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to a power line PL and the capacitor 4, and the other is connected to an anode of the display element 20. A common voltage is applied to a cathode of the display element 20. Incidentally, the configuration of the pixel circuit 1 is not limited to the illustrated example.

FIG. 2 is a schematic cross-sectional view illustrating a configuration example of the display element 20. The display element 20 includes a first electrode E1, a second electrode E2, and an organic layer OR interposed between the first electrode E1 and the second electrode E2.

The first electrode E1 is an electrode disposed for each sub-pixel SP, and may be referred to as a pixel electrode or a lower electrode. The second electrode E2 is an electrode commonly disposed for the plurality of sub-pixels SP or the plurality of display elements 20, and may be referred to as a common electrode or an upper electrode.

When a potential of the first electrode E1 is relatively higher than a potential of the second electrode E2, the first electrode E1 corresponds to the anode and the second electrode E2 corresponds to the cathode. In addition, when the potential of the second electrode E2 is relatively higher than the potential of the first electrode E1, the second electrode E2 corresponds to the anode and the first electrode E1 corresponds to the cathode.

For example, the organic layer OR includes a first functional layer F1, an emitting layer EL, and a second functional layer F2 that are sequentially stacked from the first electrode E1 to the second electrode E2. For example, when the first electrode E1 corresponds to the anode, the first functional layer F1 includes at least one of a hole-injection layer, a hole-transport layer and an electron-blocking layer, and the second functional layer F2 includes at least one of an electron-transport layer, an electron-injection layer, and a hole-blocking layer.

When a potential difference is formed between the first electrode E1 and the second electrode E2, the emitting layer EL emits light. In the present embodiment, the emitting layer EL of the sub-pixel SP1 emits light corresponding to a red wavelength, the emitting layer EL of the sub-pixel SP2 emits light corresponding to a green wavelength, and the emitting layer EL of the sub-pixel SP3 emits light corresponding to a blue wavelength.

FIG. 3 is a diagram illustrating an example of the layout of the sub-pixels SP1, SP2, SP3. Here, note the two pixels PX arranged in the second direction Y. In each pixel PX, the sub-pixels SP1, SP2, SP3 are arranged in the first direction X in this order. That is, in the display area DA, a column including the plurality of sub-pixels SP1 arranged in the second direction Y, a column including the plurality of sub-pixels SP2 arranged in the second direction Y, and a column including the plurality of sub-pixels SP3 arranged in the second direction Y are alternately disposed in the first direction X.

The sub-pixels SP1, SP2, SP3 have a light emission region EA. For example, the light emission region EA has a rectangular shape having a pair of short sides parallel to the first direction X and a pair of long sides parallel to the second direction Y.

In FIG. 3, an end portion S1 of the first electrode E1 (outer shape of the first electrode E1) is shown by an alternate long and short dash line. In the example of FIG. 3, the first electrode E1 has a rectangular shape having a size one size larger than the light emission region EA. The end portion S1 can also be referred to as a peripheral edge or a side.

The end portion S1 has a first side S1a, a second side S1b, a third side S1c, and a fourth side S1d. The first side S1a and the second side S1b are parallel to the first direction X. The third side S1c and the fourth side S1d are parallel to the second direction Y.

As will be described later more specifically, a trench TR11 is provided between the light emission regions EA of the sub-pixels SP1, SP2, SP3. The trench TR11 has a portion located between the sub-pixels SP adjacent to each other in the first direction X and a portion located between the sub-pixel SPs adjacent to each other in the second direction Y. A filling layer 14 is disposed in the trench TR11. The filling layer 14 has a shape similar to that of the trench TR11. That is, the trench TR11 and the filling layer 14 have a grid pattern that overlaps the boundaries of the plurality of sub-pixels SP. The end portion S1 (sides S1a, S1b, S1c, S1d) of each first electrode E1 overlaps the trench TR11 and the filling layer 14 in planar view.

Each first electrode E1 is connected to the pixel circuit 1 through a contact hole CH. The contact hole CH is provided in the vicinity of the first side S1a and overlaps the trench TR11 and the filling layer 14 in planar view.

Figure 4:
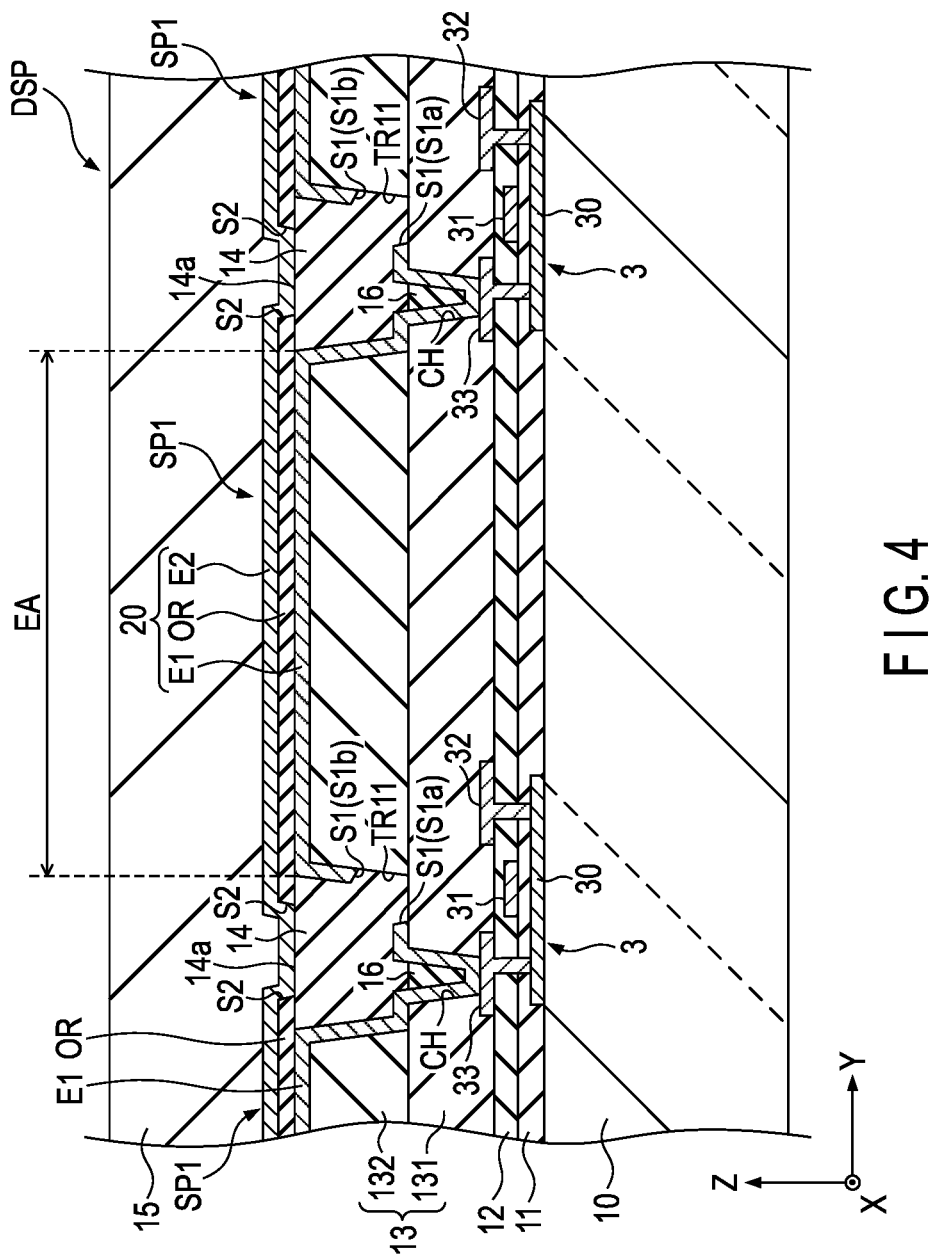
FIG. 4 is a schematic cross-sectional view of the display device along IV-IV line of FIG. 3.

FIG. 4 is a schematic cross-sectional view of the display device DSP along IV-IV line of FIG. 3. In FIG. 4, the drive transistor 3 and the display element 20 are illustrated as the elements disposed in the sub-pixels SP1, SP2, SP3, and the other elements are not illustrated.

The display device DSP includes a base 10, insulating layers 11, 12, 13, a filling layer 14, and a sealing layer 15. The insulating layers 11, 12, 13 are stacked on the base 10 in a third direction Z. For example, the insulating layers 11, 12 are made of an inorganic material, and the insulating layer 13, the filling layer 14, and the sealing layer 15 are made of an organic material.

The pixel circuit 1 including the drive transistor 3 is disposed on the base 10 and is covered with the insulating layer 13. The drive transistor 3 includes a semiconductor layer 30 and electrodes 31, 32, 33. The electrode 31 corresponds to a gate electrode. One of the electrodes 32, 33 corresponds to the source electrode, and the other corresponds to the drain electrode. The semiconductor layer 30 is interposed between the base 10 and the insulating layer 11. The electrodes 31 are interposed between the insulating layers 11, 12. The electrodes 32, 33 are interposed between the insulating layers 12, 13 and are in contact with the semiconductor layer 30 through contact holes penetrating the insulating layers 11, 12.

In the example of FIG. 4, the insulating layer 13 includes a first layer 131 and a second layer 132. The first layer 131 covers the insulating layer 12 and the electrodes 32, 33. The second layer 132 covers the first layer 131.

The second layer 132 includes the trench TR11 described above. The trench TR11 can also be referred to as a groove, recess portion, slit or the like. In the example of FIG. 3, the trench TR11 penetrates the second layer 132. The trench TR11 may extend to the first layer 131. The first layer 131 includes the contact hole CH described above. The contact hole CH is located at the bottom of the trench TR11. The contact hole CH penetrates the first layer 131 and exposes the electrode 33 from the first layer 131.

The first electrode E1 is disposed on the insulating layer 13 (above the second layer 132). The end portion S1 (sides S1a, S1b) of the first electrode E1 is located inside the trench TR11. The portion of the first electrode E1 near the first side S1a is in contact with the electrode 33 through the contact hole CH. The first electrode E1 is made of a metal material. However, the first electrode E1 may be formed of a transparent conductive material such as indium tin oxide (ITO) or indium zinc oxide (IZO), or may be a stacked layer body of a transparent conductive material and a metal material.

The filling layer 14 described above fills at least a portion of the trench TR11. In the example of FIG. 3, the filling layer 14 fills the entire trench TR11, and an upper surface of the first electrode E1 and an upper surface of the filling layer 14 in the periphery of the trench TR11 match with each other in the third direction Z. The filling layer 14 covers one end portion S1 (first side S1a) and the other end portion S1 (second side S1b) of two first electrodes E1 adjacent to each other in the second direction Y.

The end portions S1 of two adjacent first electrodes E1 are spaced apart from each other. In the example of FIG. 4, the first side S1a is located at the bottom of the trench TR11, and the second side S1b is located at the side surface of the trench TR11. However, when the end portions S1 of the two adjacent first electrodes E1 are spaced apart from each other, the positions of the first side S1a and the second side S1b are not limited to the illustrated example. For example, the second side S1b may be located at the bottom of the trench TR11.

In the example of FIG. 4, the inside of the portion of the first electrode E1 recessed by the contact hole CH is filled with an insulating filling layer 16. The filling layer 16 may be a layer different from the filling layer 14, or may be a part of the filling layer 14.

The organic layer OR is provided for each sub-pixel SP and covers the first electrode E1. The organic layer OR has an end portion S2. The end portion S2 is located on the filling layer 14. That is, the portion of the organic layer OR in the vicinity of the end portion S2 is not in contact with the first electrode E1.

The second electrode E2 covers the organic layer OR. The second electrode E2 is made of a metal material. However, the second electrode E2 may be formed of a transparent conductive material such as ITO or IZO. In the example of FIG. 4, the second electrode E2 is continuously formed over the plurality of sub-pixels SP1. A part of the second electrode E2 is located on the filling layer 14 between the adjacent organic layers OR.

The sealing layer 15 is disposed on the second electrode E2. The sealing layer 15 is formed thicker than, for example, the insulating layers 11, 12, and protects the organic layer OR from moisture and the like.

The portion of the first electrode E1 that is not covered with the filling layer 14 corresponds to the light emission region EA described above. In the light emission region EA, the lower surface of the organic layer OR is in contact with the first electrode E1, and the upper surface of the organic layer OR is in contact with the second electrode E2. When a potential difference is formed between the first electrode E1 and the second electrode E2, the light emission region EA mainly emits light.

FIG. 5 is a schematic cross-sectional view of the display device DSP along V-V line of FIG. 3. As similar to the example of FIG. 4, a part of the organic layer OR and a part of the second electrode E2 are located on the filling layer 14. In addition, one end portion S1 (third side S1c) and the other end portion S1 (fourth side S1d) of the first electrodes E1 adjacent to each other in the first direction X are located inside the trench TR11.

The end portions S1 of adjacent first electrodes E1 are spaced apart from each other. In the example of FIG. 5, the third side S1c is located on one of the pair of side surfaces of the trench TR11, and the fourth side S1d is located on the other side.

FIG. 6 is a schematic cross-sectional view illustrating another example applicable to the display device DSP. In the example of this drawing, both the third side S1c and the fourth side S1d are located at the bottom of the trench TR11. In addition to the examples illustrated in FIGS. 5 and 6, the third side S1c and the fourth side S1d can be disposed in the trench TR11 in various ways.

As described above, in the present embodiment, each of the sides S1a, S1b, S1c, S1d of the first electrode E1 is located in the trench TR11 and is covered with the filling layer 14. That is, the end portion S1 of the first electrode E1 is located inside the trench TR11 over the entire circumference and is covered with the filling layer 14.

In FIG. 4, the cross-sectional structures of the plurality of sub-pixels SP1 arranged in the second direction Y are illustrated. However, a structure similar to that illustrated in FIG. 4 can be applied to the cross-sectional structures of the plurality of sub-pixels SP2 arranged in the second direction Y and the cross-sectional structures of the plurality of sub-pixels SP3 arranged in the second direction Y. In addition, in FIGS. 5 and 6, the cross-sectional structures of the sub-pixels SP1, SP2 arranged in the first direction X are illustrated. However, a similar structure to those illustrated in FIGS. 5 and 6 can be applied to the cross-sectional structures of the sub-pixels SP2, SP3 arranged in the first direction X and the cross-sectional structures of the sub-pixels SP1, SP3 arranged in the first direction X.

For example, at the time of manufacturing the display device DSP, a conductive layer as a base of the first electrode E1 is formed, and the first electrode E1 is formed by patterning the conductive layer by etching. In this case, the end portion S1 of the first electrode E1 may not have the shape as designed and may include unintended uneven parts. The organic layer OR is formed by vapor deposition using, for example, a mask. In this case, the end portion of the organic layer OR tends to be thin. For this reason, if the organic layer OR and the second electrode E2 are disposed on the end portion S1 of the first electrode E1, there is a risk of conduction between the first electrode E1 and the second electrode E2 due to the first electrode E1 penetrating the organic layer OR.

On the other hand, in the present embodiment, the end portion S1 of the first electrode E1 is located in the trench TR11 and is covered with the filling layer 14. Therefore, the risk of conduction between the first electrode E1 and the second electrode E2 at the end portion S1 can be significantly reduced.

Incidentally, if only the risk of conduction between the first electrode E1 and the second electrode E2 is to be reduced, for example, a configuration is also conceivable in which the end portion S1 is disposed on the insulating layer 13, and an insulating rib covering the end portion S1 is disposed between the sub-pixels SP. However, in this case, uneven parts due to the rib occur. In order to planarize these uneven parts, it is necessary to form a sealing layer 15 that is sufficiently thicker than the ribs.

On the other hand, in the present embodiment, since a substantially even surface is formed by the insulating layer 13 and the filling layer 14, the uneven parts as described above are unlikely to occur. Therefore, the sealing layer 15 can be made thin.

In addition to the above examples, various preferable effects can be obtained from the present embodiment.

Other embodiments of the display device DSP will be disclosed below. The configurations not particularly mentioned in these embodiments are the same as those in the first embodiment.

Second Embodiment

Figure 7:
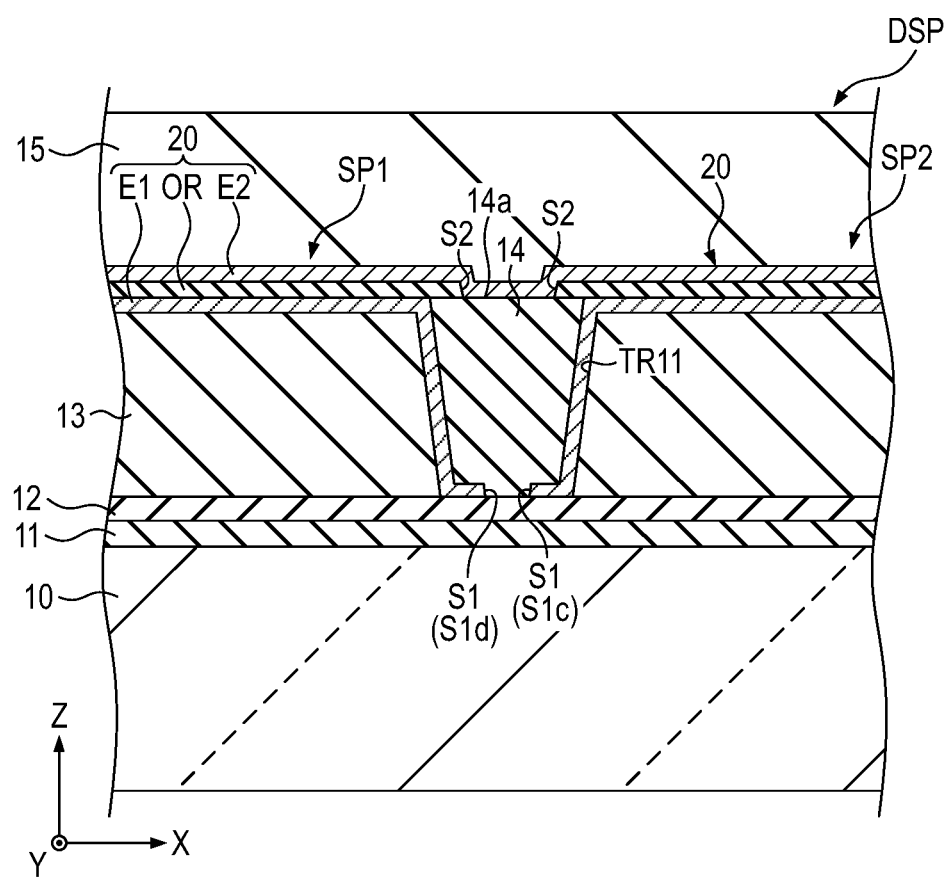
FIG. 7 is a schematic cross-sectional view of a display device according to a second embodiment.

FIG. 7 is a schematic cross-sectional view of a display device DSP according to a second embodiment. This cross-sectional view shows the structure near the boundary of the sub-pixels SP1, SP2 arranged in the first direction X as in FIG. 5. A similar structure can be applied to the boundary between the sub-pixels SP2, SP3 arranged in the first direction X, the boundary between the sub-pixels SP1, SP3 arranged in the first direction X, the boundary between the two sub-pixels SP1 arranged in the second direction Y, the boundary between the two sub-pixels SP2 arranged in the second direction Y, and the boundary of the two sub-pixels SP3 arranged in the second direction Y.

In the example of FIG. 7, the insulating layer 13 is a single insulating layer. The trench TR11 penetrates the insulating layer 13. One end portion S1 (third side S1c) and the other end portion S1 (fourth side S1d) of the two first electrodes E1 adjacent to each other in the first direction X are both located at the bottom of the trench TR11, and in contact with the insulating layer 12.

Incidentally, in the example of FIG. 7, the trench TR11 does not have to penetrate the insulating layer 13. In addition, the end portion S1 of each first electrode E1 may be located on the side surface of the trench TR11.

Third Embodiment

Figure 8:
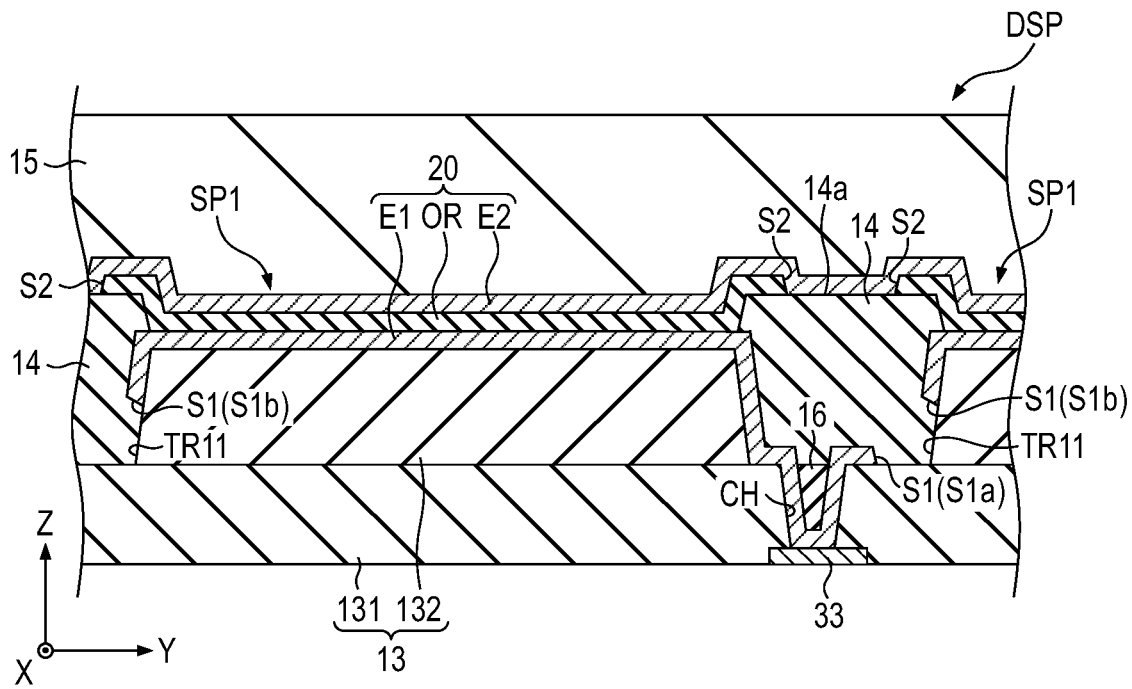
FIG. 8 is a schematic cross-sectional view of a display device according to a third embodiment.

FIG. 8 is a schematic cross-sectional view of a display device DSP according to a third embodiment. This cross-sectional view shows the structure in the vicinity of the boundary between the two sub-pixels SP1 arranged in the second direction Y as in FIG. 4, and the elements below the insulating layer 13 are not illustrated. A similar structure can be applied to the boundary between two sub-pixels SP2 arranged in the second direction Y, the boundary between two sub-pixels SP3 arranged in the second direction Y, the boundary between the sub-pixels SP1, SP2 arranged in the first direction X, the boundary between the sub-pixels SP2, SP3 arranged in the first direction X, and the boundary of the sub-pixels SP1, SP3 arranged in the first direction X.

In the example of FIG. 8, the upper surface 14a of the filling layer 14 protrudes upward from the upper surface of the surrounding first electrode E1 and the upper surface of the second layer 132. As a result, the organic layer OR and the second electrode E2 are formed with uneven parts due to the filling layer 14. The amount of protrusion of the filling layer 14 (distance in the third direction Z between the upper surface 14a and the upper surface of the second layer 132) is smaller than the depth of the trench TR11. Even when the upper surface 14a of the filling layer 14 protrudes slightly as described above, similar effects as in the first embodiment can be obtained.

Fourth Embodiment

Figure 9:
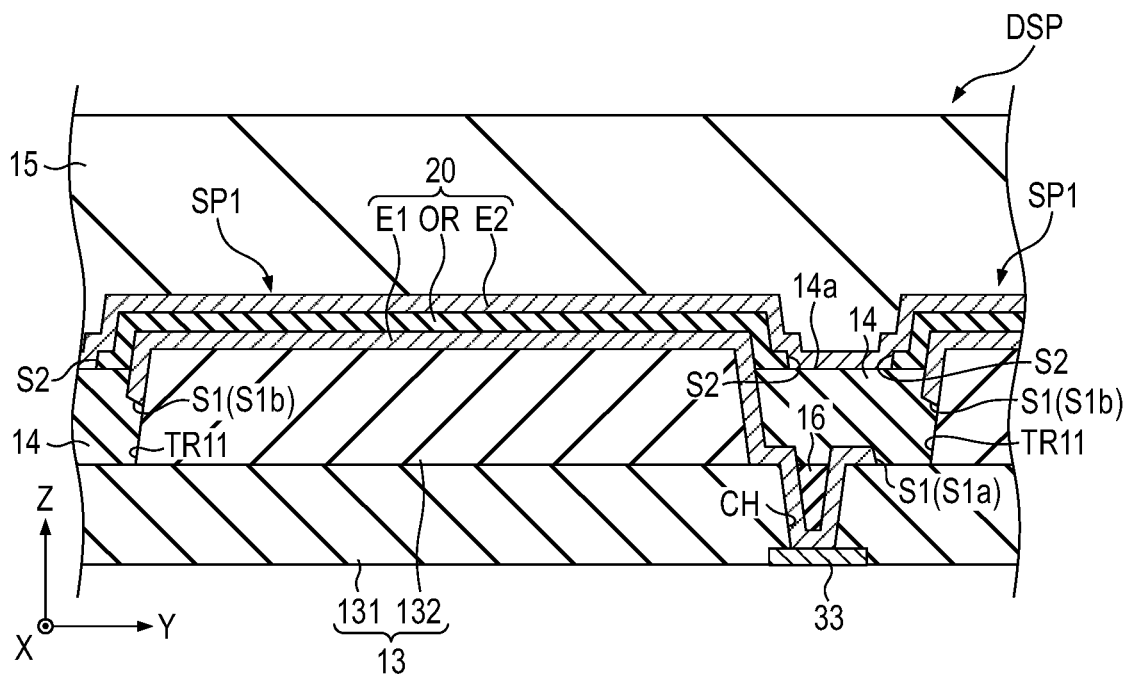
FIG. 9 is a schematic cross-sectional view of a display device according to a fourth embodiment.

FIG. 9 is a schematic cross-sectional view of a display device DSP according to a fourth embodiment. This cross-sectional view shows the structure in the vicinity of the boundary between the two sub-pixels SP1 arranged in the second direction Y as in FIG. 4, and the elements below the insulating layer 13 are not illustrated. A similar structure can be applied to the boundary between two sub-pixels SP2 arranged in the second direction Y, the boundary between two sub-pixels SP3 arranged in the second direction Y, the boundary between the sub-pixels SP1, SP2 arranged in the first direction X, the boundary between the sub-pixels SP2, SP3 arranged in the first direction X, and the boundary of the sub-pixels SP1, SP3 arranged in the first direction X.

In the example of FIG. 9, the upper surface 14a of the filling layer 14 is located slightly below the upper surface of the surrounding first electrode E1 and the upper surface of the second layer 132. That is, the filling layer 14 fills a part of the trench TR11. Even with such a configuration, similar effects to that of the first embodiment can be obtained.

In the example of FIG. 9, the end portion S2 of the organic layer OR is located on the upper surface 14a. An angled portion of the organic layer OR in the vicinity of the end portion S2 is sandwiched between the first electrode E1 and the second electrode E2. For this reason, when a potential difference is formed between the first electrode E1 and the second electrode E2, the portion of the organic layer OR can emit light. The organic layer OR may be thin in this portion, which may cause a degradation of the color purity or a deviation in color chromaticity of the light emitted by the organic layer OR. From the point of view of suppressing these, it is preferable that the filling layer 14 completely fills the trench TR11.

Fifth Embodiment

Figure 10:
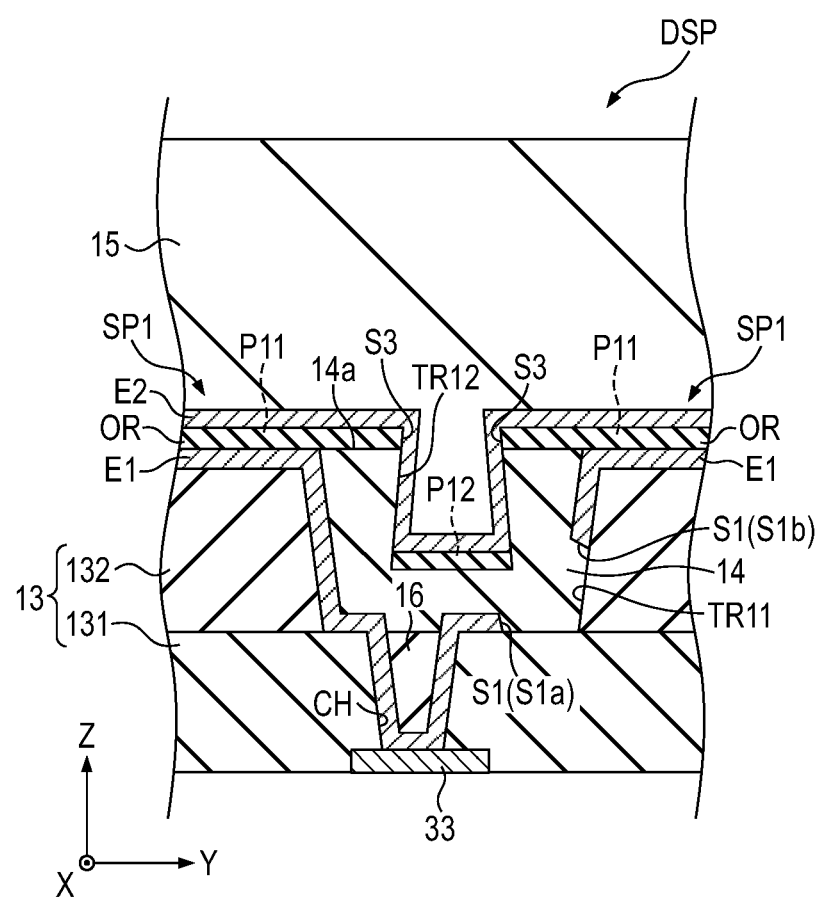
FIG. 10 is a schematic cross-sectional view of a display device according to a fifth embodiment.

FIG. 10 is a schematic cross-sectional view of a display device DSP according to a fifth embodiment. This cross-sectional view shows the structure in the vicinity of the boundary between the two sub-pixels SP1 arranged in the second direction Y as in FIG. 4, and the elements below the insulating layer 13 are not illustrated. A similar structure can be applied to the boundary between two sub-pixels SP2 arranged in the second direction Y, the boundary between two sub-pixels SP3 arranged in the second direction Y, the boundary between the sub-pixels SP1, SP2 arranged in the first direction X, the boundary between the sub-pixels SP2, SP3 arranged in the first direction X, and the boundary of the sub-pixels SP1, SP3 arranged in the first direction X.

In the present embodiment, it is assumed that the emitting layer EL included in the organic layer OR of the sub-pixels SP1, SP2, SP3 all emit light of the same color (for example, white). In this case, for example, color filters corresponding to the colors of the sub-pixels SP1, SP2, SP3 may be disposed above the sealing layer 15. In addition, a layer including quantum dots that are excited by the light emitted by the emitting layer EL to generate light of colors corresponding to the sub-pixels SP1, SP2, SP3 may be disposed in the sub-pixels SP1, SP2, SP3.

In the example of FIG. 10, the filling layer 14 includes a trench TR12. In addition, the organic layer OR includes a first portion P11 located outside the trench TR12 and a second portion P12 located inside the trench TR12. The first portion P11 covers the first electrode E1. The second portion P12 covers the bottom surface of the trench TR12.

The trench TR12 and the second portion P12 are formed as a whole with respect to the filling layer 14 having a grid pattern illustrated in FIG. 3, for example. In this case, the trench TR12 and the second portion P12 also have a grid pattern.

For example, the trench TR12 has an inverted tapered shape in which the width increases downward from the upper surface 14a. The trench TR12 may have other shapes, such as an overhang shape with a portion of the side surface protruding, for example.

The first portion P11 and the second portion P12 are made of the same material. The second portion P12 is spaced apart from the first portions P11 disposed in the two adjacent sub-pixels SP1, respectively. The second electrode E2 covers the first portion P11 on the outside of the trench TR12. In addition, the second electrode E2 covers the side surface of the trench TR12 and the second portion P12.

The organic layer OR is formed on the entire surface of the display area DA by, for example, vacuum vapor deposition. In this case, the material from the vapor deposition source adheres to the bottom of the trench TR12, so that the second portion P12 is formed. In contrast, the material from the vapor deposition source does not easily adhere to the side surface of the trench TR12. As a result, the first portion P11 and the second portion P12 are separated. The second electrode E2 is formed by a method such as chemical vapor deposition (CVD), which has a high film-forming property on a wall portion such as the side surface of the trench TR12.

In the configuration of FIG. 10, the organic layer OR (first portion P11) arranged in each of the sub-pixels SP1, SP2, SP3 is spaced apart. As a result, crosstalk between adjacent sub-pixels is suppressed, and the display quality of the display device DSP can be improved.

FIG. 11 is a schematic cross-sectional view illustrating another example of the display device DSP according to the present embodiment. In the example of this drawing, the trench TR12 is filled with an insulating filling layer 40. The filling layer 40 is made of, for example, an organic material and covers the second portion P12. The filling layer 40 also covers the end portion S3 of the first portion P11. The second electrode E2 covers the upper surface of the filling layer 40. That is, a part of the second electrode E2 is located on the filling layer 40.

In the example of FIG. 10, even when the second electrode E2 is formed by a method having a high film forming property, a part of the second electrode E2 may be divided depending on the shape of the trench TR12. In this regard, if the trench TR12 is filled with the filling layer 40 As shown in FIG. 11, the risk of division of the second electrode E2 can be reduced.

Sixth Embodiment

Figure 12:
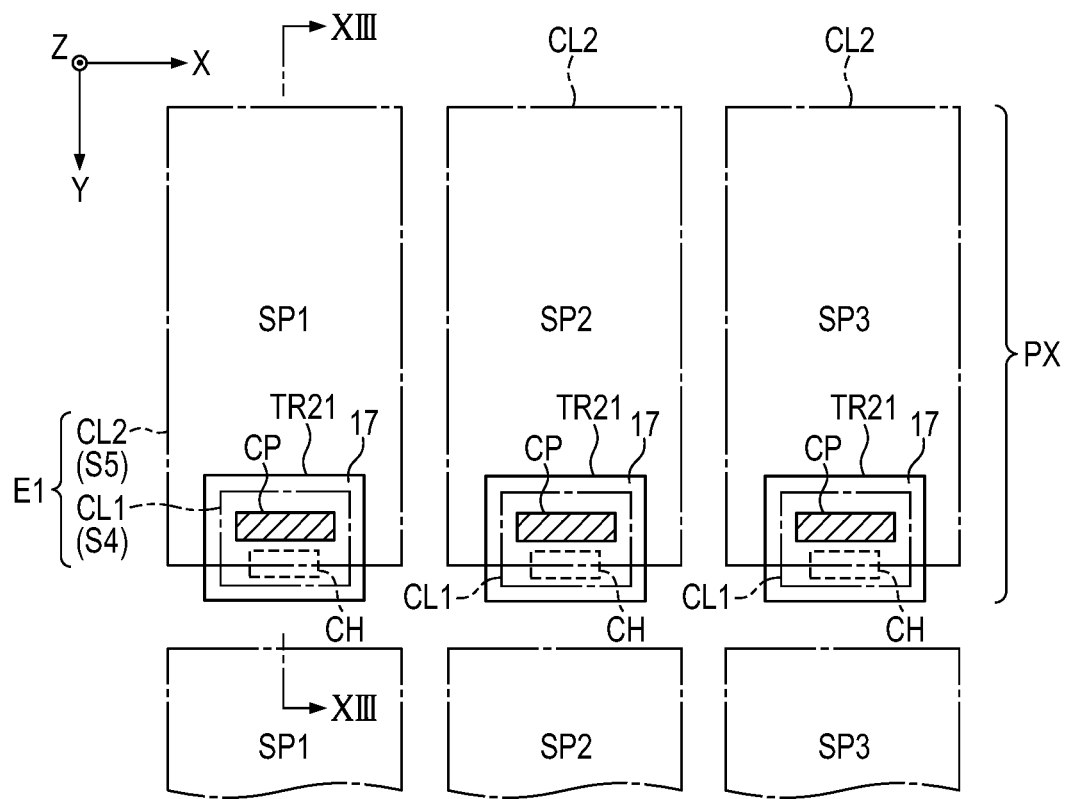
FIG. 12 is a schematic plan view of sub-pixels according to a sixth embodiment.
Figure 13:
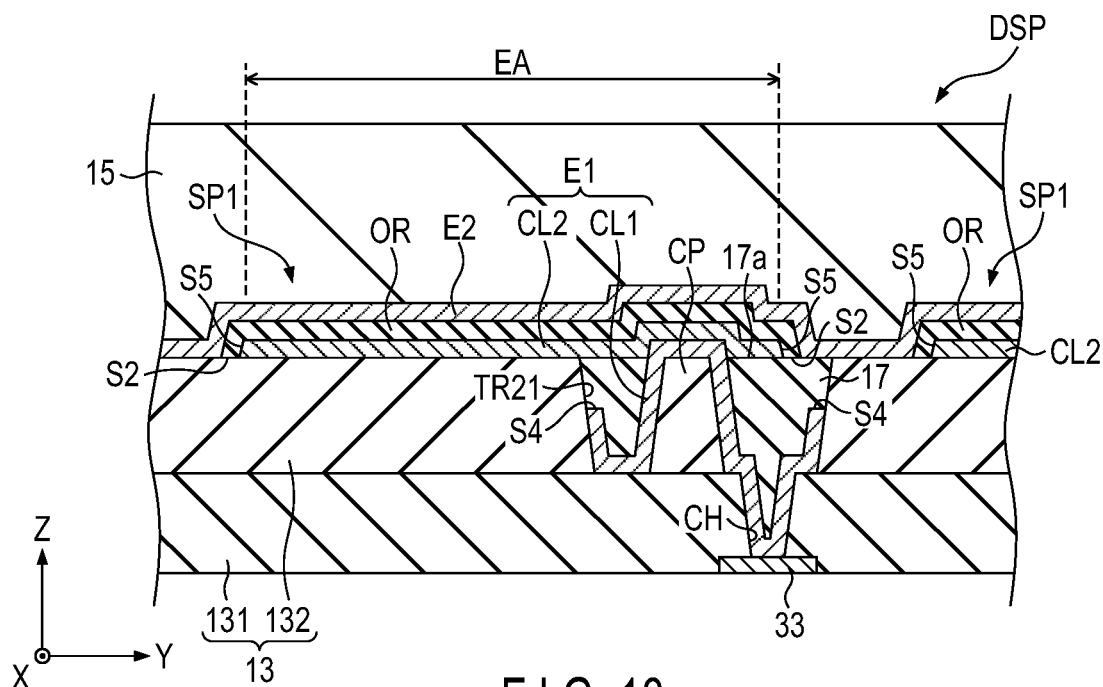
FIG. 13 is a schematic cross-sectional view of the display device along XIII-XIII line of FIG. 12.

FIG. 12 is a schematic plan view of sub-pixels SP1, SP2, SP3 according to a sixth embodiment. FIG. 13 is a schematic cross-sectional view of the display device DSP along XIII-XIII line of FIG. 12. In FIG. 13, the elements below the insulating layer 13 are not illustrated. A similar structure to that in FIG. 13 can be applied to the boundary between the two sub-pixels SP2 arranged in the second direction Y and the boundary between the two sub-pixels SP3 arranged in the second direction Y.

In the present embodiment, the first electrode E1 includes a first conductive layer CL1 and a second conductive layer CL2. The second layer 132 of the insulating layer 13 includes a trench TR21 and a connector CP.

As shown in FIG. 12, the trench TR21 is provided for each of the sub-pixels SP1, SP2, SP3. The trench TR21 has a rectangular frame shape in the example illustrated, but is not limited to this example. The connector CP is surrounded by the trench TR21.

In FIG. 12, the shape of the end portion S4 of the first conductive layer CL1 is indicated by an alternate long and short dash line, and the shape of the end portion S5 of the second conductive layer CL2 is indicated by an alternate long and short dash line. The second conductive layer CL2 has a sufficiently larger area than that of the first conductive layer CL1. The first conductive layer CL1 and the second conductive layer CL2 are both rectangular, for example, but are not limited to this example.

The first conductive layer CL1 overlaps the trench TR21 in planar view. Both the first conductive layer CL1 and the second conductive layer CL2 overlap the connector CP in planar view.

As shown in FIG. 13, the trench TR21 penetrates the second layer 132. The trench TR21 may extend to the first layer 131. The contact hole CH is located at the bottom of the trench TR21.

The first conductive layer CL1 covers the connector CP. The trench TR21 is filled with an insulating filling layer 17. The filling layer 17 is made of, for example, an organic material. In the example of FIG. 13, the filling layer 17 fills the entire trench TR21, and the upper surface of the second layer 132 and the upper surface 17a of the filling layer 17 in the periphery of the trench TR21 match with each other in the third direction Z. As another example, the upper surface 17a may protrude above the upper surface of the second layer 132. In addition, the upper surface 17a may be located below the upper surface of the second layer 132.

The end portion S4 of the first conductive layer CL1 is located inside the trench TR21 over the entire circumference and is covered with the filling layer 17. In the example of FIG. 13, the end portion S4 is located on the side surface of the trench TR21, but the end portion S4 may be located at the bottom of the trench TR21. The first conductive layer CL1 is in contact with the electrode 33 through the contact hole CH.

The portion of the first conductive layer CL1 located on the connector CP is not covered with the filling layer 17. The second conductive layer CL2 is disposed on the second layer 132 and is in contact with the first conductive layer CL1 above the connector CP. As a result, the first conductive layer CL1 and the second conductive layer CL2 become conductive.

Most of the second conductive layer CL2 is located on the second layer 132, and the remaining part is located on the filling layer 17. In the cross section of FIG. 13, the end portion S5 of the second conductive layer CL2 is located on the upper surface 17a of the filling layer 17. The organic layer OR covers the second conductive layer CL2 as a whole. That is, the end portion S5 is covered with the organic layer OR. In the cross section of FIG. 13, the end portion S2 of the organic layer OR is located on the upper surface 17a. The second electrode E2 covers the organic layer OR. Between the adjacent organic layers OR, the second electrode E2 covers the upper surface 17a and the second layer 132.

The conductive layers CL1, CL2 are made of a metal material. However, the conductive layers CL1, CL2 may be formed of a transparent conductive material such as ITO, or may be a stacked layer body of a transparent conductive material and a metal material.

The first conductive layer CL1 is formed, for example, by forming a base conductive layer on the second layer 132 as a whole and then patterning the conductive layer by etching. In this case, as similar to the first electrode E1 in the first embodiment, the shape of the end portion S4 of the first conductive layer CL1 may be disturbed. In the present embodiment, the end portion S4 is located inside the trench TR21 and is covered with the filling layer 17. For this reason, even if the shape of the end portion S4 is disturbed, there is no particular effect on the display.

On the other hand, the second conductive layer CL2 is formed by, for example, vapor deposition or sputtering using a mask. In this case, the end portion S5 of the second conductive layer CL2 is gentler than the end portion S4 of the first conductive layer CL1 formed by etching. For this reason, the risk of penetrating the organic layer OR and conducting with the second electrode E2 is small.

Since the second conductive layer CL2 is disposed on the filling layer 17, the second conductive layer CL2 and the organic layer OR are less likely to have uneven parts due to the trench TR21. As a result, the influence of the trench TR21 on the display quality can be suppressed.

In the structure illustrated in the cross-sectional view of each of the above-described embodiments, the end portions S1 of the two first electrodes E1 are located in the trench TR11. It is necessary to provide a sufficient distance between the end portions S1 of the first electrodes E1 so that the first electrode E1 and the trench TR11 do not conduct with each other in consideration of the processing accuracy. If this distance is large, the area of the light emission region EA becomes small.

Alternatively, in the present embodiment, the trench TR11 is provided for each sub-pixel SP, and the first conductive layer CL1 is disposed in each trench TR11. With this structure, there is no risk of conduction between the first conductive layers CL1 of the adjacent sub-pixels SP. In addition, the second conductive layer CL2 can be formed without considering the processing accuracy of the trench TR21. As a result, a wide light emission region, that is, a region in which the second conductive layer CL2, the organic layer OR, and the second electrode E2 are stacked can be secured.

Seventh Embodiment

FIG. 14 is a schematic cross-sectional view of a display device DSP according to a seventh embodiment. This cross-sectional view shows the structure in the vicinity of the boundary between the two sub-pixels SP1 arranged in the second direction Y as in FIG. 13, and the elements below the insulating layer 13 are not illustrated. A similar structure can be applied to the boundary between the two sub-pixels SP2 arranged in the second direction Y and the boundary between the two sub-pixels SP3 arranged in the second direction Y.

In the present embodiment, as in the sixth embodiment, the first electrode E1 includes a first conductive layer CL1 and a second conductive layer CL2, and an insulating layer 13 has a trench TR21. In addition, in the present embodiment, as in the fifth embodiment, it is assumed that the emitting layer EL included in the organic layer OR of the sub-pixels SP1, SP2, SP3 all emit light of the same color (for example, white). In this case, for example, color filters corresponding to the colors of the sub-pixels SP1, SP2, SP3 may be disposed above the sealing layer 15. In addition, a layer including quantum dots that are excited by the light emitted by the emitting layer EL to generate light of colors corresponding to the sub-pixels SP1, SP2, SP3 may be disposed in the sub-pixels SP1, SP2, SP3.

In the example of FIG. 14, the insulating layer 13 further includes a trench TR22. In addition, the organic layer OR includes a first portion P21 located outside the trench TR22 and a second portion P22 located inside the trench TR22. The first portion P21 covers the second conductive layer CL2. The second portion P22 covers the bottom surface of the trench TR22.

The trench TR22 is provided in the second layer 132 at a position not overlapping with the second conductive layer CL2, for example, As shown in the drawing. The trench TR22 may extend to the first layer 131.

For example, the trench TR22 and the second portion P22 are grid patterns formed in each of between two sub-pixels SP1 adjacent to each other in the second direction Y, between two sub-pixels SP2 adjacent to each other in the second direction Y, two sub-pixels SP3 adjacent to each other in the second direction Y, between the sub-pixels SP1 and SP2 adjacent to each other in the first direction X, between the sub-pixels SP2 and SP3 adjacent to each other in the first direction X, and between the sub-pixels SP1 and SP3 adjacent to each other in the first direction X.

For example, the trench TR22 has an inverted tapered shape in which the width increases downward from the upper surface of the second layer 132. The trench TR22 may have other shapes, such as an overhang shape with a portion of the side surface protruding, for example.

The first portion P21 and the second portion P22 are made of the same material. The second portion P22 is spaced apart from the first portions P21 disposed in the two adjacent sub-pixels SP1. The second electrode E2 covers the first portion P21 on the outside of the trench TR22. In addition, the second electrode E2 covers the side surface of the trench TR22 and the second portion P22.

The organic layer OR is formed on the entire surface of the display area DA by, for example, vacuum vapor deposition. In this case, the material from the vapor deposition source adheres to the bottom of the trench TR22, so that the second portion P22 is formed. Alternatively, the material from the vapor deposition source does not easily adhere to the side surface of the trench TR22. As a result, the first portion P21 and the second portion P22 are separated. The second electrode E2 is formed by a method such as CVD, which has a high film forming property on a wall portion such as the side surface of the trench TR22.

In the configuration of FIG. 14, the organic layer OR (first portion P21) arranged in each of the sub-pixels SP1, SP2, SP3 is spaced apart. As a result, crosstalk between adjacent sub-pixels is suppressed, and the display quality of the display device DSP can be improved.

FIG. 15 is a schematic cross-sectional view illustrating another example of the display device DSP according to the present embodiment. In the example of this drawing, the trench TR22 is filled with an insulating filling layer 41. The filling layer 41 is made of, for example, an organic material and covers the second portion P22. The filling layer 41 also covers the end portion S6 of the first portion P21. The second electrode E2 covers the upper surface of the filling layer 41. That is, a part of the second electrode E2 is located on the filling layer 41. If the trench TR22 is filled with the filling layer 41 as described above, the risk of division of the second electrode E2 by the trench TR22 can be reduced.

FIG. 16 is a schematic cross-sectional view illustrating still another example of the display device DSP according to the present embodiment. In the example of this drawing, the second conductive layer CL2 includes a third portion P23 located outside the trench TR22 and a fourth portion P24 located inside the trench TR22. The third portion P23 is in contact with the first conductive layer CL1 at the connector CP and is entirely covered with the first portion P21 of the organic layer OR. The fourth portion P24 is covered with the second portion P22 of the organic layer OR. The third portion P23 and the fourth portion P24 are made of the same material.

In the example of FIG. 16, the second conductive layer CL2 is formed, for example, by vapor deposition or sputtering on the entire surface of the display area DA. At this time, the material that is the base of the second conductive layer CL2 adheres to the bottom of the trench TR22, so that the fourth portion P24 is formed. On the other hand, since the material does not easily adhere to the side surface of the trench TR22, the third portion P23 and the fourth portion P24 are separated.

In the example of FIG. 16, the end portion S7 of the third portion P23 is covered with the first portion P21. As a result, the conduction between the third portion P23 and the second electrode E2 is suppressed.

FIG. 17 is a schematic cross-sectional view illustrating still another example of the display device DSP according to the present embodiment. In the example of this drawing, the trench TR22 is filled with a filling layer 41. The filling layer 41 covers the end portion S6 of the first portion P21 and the second portion P22. The second electrode E2 covers the upper surface of the filling layer 41. As similar to the example of FIG. 15, if the trench TR22 is filled with the filling layer 41 as described above, the risk of division of the second electrode E2 by the trench TR22 can be reduced.

In each embodiment, the trenches TR11, TR21 are examples of the first trench, and the trenches TR12, TR22 are examples of the second trench. In addition, the filling layers 14, 17 are examples of the first filling layer, and the filling layers 40, 41 are examples of the second filling layer.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:
1. A display device comprising:
a pixel circuit;
an insulating layer that covers the pixel circuit and includes a first trench;
a first electrode disposed on the insulating layer;
an organic layer disposed on the first electrode;
a second electrode disposed on the organic layer; and
a first filling layer that fills at least a part of the first trench,
wherein an end portion of the first electrode is located inside the first trench and is covered with the first filling layer,
the first trench has a grid pattern that overlaps boundaries of a plurality of pixels, and
an end portion of the first electrode is located inside the first trench over an entire circumference of the first electrode and is covered with the first filling layer.
2. The display device of claim 1,
wherein a part of the second electrode is located on the first filling layer.
3. The display device of claim 1,
wherein an end portion of the organic layer is located on the first filling layer.
4. The display device of claim 1,
wherein the insulating layer includes a first layer and a second layer covering the first layer,
the first trench is formed in the second layer,
the first layer includes a contact hole located at a bottom of the first trench, and
the first electrode is connected to the pixel circuit through the contact hole.
5. The display device of claim 1,
wherein the first filling layer includes a second trench,
the organic layer includes a first portion located outside the second trench and a second portion located inside the second trench, and
the first portion and the second portion are spaced apart from each other.
6. The display device of claim 5, further comprising
a second filling layer that fills the second trench and covers the second portion,
wherein a part of the second electrode is located on the second filling layer.
7. The display device of claim 1,
wherein a part of the end portion of the first electrode is located on a side surface of the first trench.
8. The display device of claim 1,
wherein a part of the end portion of the first electrode is located at a bottom of the first trench.
9. The display device of claim 1,
wherein an upper surface of the first filling layer protrudes from an upper surface of the insulating layer.
10. The display device of claim 1,
wherein an upper surface of the first filling layer is located below an upper surface of the insulating layer.
11. A display device comprising:
a pixel circuit;

an insulating layer that covers the pixel circuit and has a first trench;
a first electrode disposed on the insulating layer;
an organic layer disposed on the first electrode;
a second electrode disposed on the organic layer; and
a first filling layer that fills the first trench,
wherein the first electrode includes a first conductive layer and a second conductive layer connected to the first conductive layer,
an end portion of the first conductive layer is located inside the first trench and is covered with the first filling layer,
the second conductive layer is located on the insulating layer and the first filling layer,
the insulating layer includes a connector surrounded by the first trench, and
a part of the first conductive layer is located on the connector and is in contact with the second conductive layer.

12. The display device of claim 11,
wherein an end portion of the second conductive layer is covered with the organic layer.

13. The display device of claim 11,
wherein the insulating layer further includes a second trench,
the organic layer includes a first portion located outside the second trench and a second portion located inside the second trench, and
the first portion and the second portion are spaced apart from each other.

14. The display device of claim 13,
wherein the second conductive layer includes a third portion located outside the second trench and a fourth portion located inside the second trench,
the third portion is covered with the first portion, and
the fourth portion is covered with the second portion.

15. The display device of claim 14,
wherein an end portion of the third portion is covered with the first portion.

16. The display device of claim 13, further comprising
a second filling layer that fills the second trench and covers the second portion,
wherein a part of the second electrode is located on the second filling layer.

17. The display device of claim 11,
wherein the insulating layer includes a first layer and a second layer covering the first layer,
the first trench is formed in the second layer,
the first layer includes a contact hole located at a bottom of the first trench, and
the first conductive layer is connected to the pixel circuit through the contact hole.

18. The display device of claim 11,
wherein an end portion of the first conductive layer is located on a side surface of the first trench.

* * * * *